(12) United States Patent
Ishida et al.

(10) Patent No.: US 6,198,112 B1
(45) Date of Patent: Mar. 6, 2001

(54) III-V COMPOUND SEMICONDUCTOR LUMINESCENT DEVICE

(75) Inventors: Masaya Ishida, Nara; Shiro Sakai, Tokushima, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 08/867,274

(22) Filed: Jun. 2, 1997

Related U.S. Application Data (63) Continuation of application No. 08/409,816, filed on Mar. 23, 1995, now abandoned.

(30) Foreign Application Priority Data

Mar. 23, 1994 (JP) .................................................. 6-051454

(51) Int. Cl.$^7$ .................................................. H01L 29/06
(52) U.S. Cl. .................. 257/15; 257/94; 257/103; 257/200; 257/201
(58) Field of Search .................. 257/12, 13, 15, 257/21, 94–97, 103, 200, 201; 437/107, 126

(56) References Cited

U.S. PATENT DOCUMENTS

| | | | | |
|---|---|---|---|---|
| 5,005,057 | * | 4/1991 | Izumiya et al. | 257/13 |
| 5,082,798 | * | 1/1992 | Arimoto | 437/107 |
| 5,178,718 | * | 1/1993 | De Keijser et al. | 437/107 |
| 5,247,533 | * | 9/1993 | Okazaki et al. | 257/13 |

FOREIGN PATENT DOCUMENTS

| | | | |
|---|---|---|---|
| 61-88573 | 5/1986 | (JP) . | |
| 62-154789 | * | 7/1987 | (JP) .................................. 257/13 |
| 64-32693 | 2/1989 | (JP) . | |
| 2-303068 | 12/1990 | (JP) . | |
| 3-79088 | 4/1991 | (JP) . | |
| 5-243613 | 9/1993 | (JP) . | |

OTHER PUBLICATIONS

Kahn, M.A., et al. "GaN/AlN digital alloy short–period superlattices by switched atomic layer metal organic chemical vapor deposition," *Appl. Phys. Lett.* (1993) 63(25):3470–72.

Weyers, M., et al. "Growth of GaAsN alloys by low–pressure metalorganic chemical vapor deposition using plasma–cracked $NH_3$," *Appl. Phys. Lett.* (1993) 62(12):1396–1398.

Igarashi, O. "Heteroepitaxial growth of $GaN_{1-x}P_x$ (x<0.09) on sapphire substrates," *Jpn. J. Appl. Phys.* (1992) 31(1):3791–93.

* cited by examiner

*Primary Examiner*—Sara Crane
(74) *Attorney, Agent, or Firm*—Morrison & Foerster, LLP (57) ABSTRACT

The present invention provides a III-V compound semiconductor having a laminated superlattice structure in which a first monoatomic layer and a second monoatomic layer are regularly laminated, the first monoatomic layer being formed by laminating 1 atomic layer of a group III atom selected from Al, Ga and In and 1 atomic layer of a group V atom selected from P, As and Sb, the second monoatomic layer being formed by laminating 1 atomic layer of the group III atom and 1 atomic layer of a nitrogen atom, and a semiconductor device using the same.

9 Claims, 8 Drawing Sheets

III-V COMPOUND SEMICONDUCTOR LUMINESCENT DEVICE

This application is a file wrapper continuation of application Ser. No. 08/409,816, filed Mar. 23, 1995, now abandoned.

BACKGROUND OF THE INVENTION

1. Field of the Invention

The present invention relates to a semiconductor having a band gap of a mixed crystal formed of a III-V compound semiconductor other than nitride and III-nitrogen compound semiconductor by varying a laminated structure of a super lattice of an atomic layer of the III-V compound semiconductor other than nitride and III-nitrogen compound semiconductor, and relates to a semiconductor device using the same.

2. Description of the Related Art

A blue luminescent device has been studied by using a semiconductor made from a group II-VI, SiC and gallium nitride (GaN) system. Recently, it has been reported that a GaN compound semiconductor exhibits an excellent luminescence at room temperature, and a blue LED using the same has also been developed. Gallium nitride is a material having a band gap of 3.4 eV at room temperature and capable of emitting an ultraviolet light. In view of the characteristics of GaN, an attempt at using a mixed crystal of GaN and III-V group compound semiconductor which has a small band gap with GaN has been made by changing the molar fraction of the mixed crystal to obtain a blue luminescence. In addition, Appl. Phys. Lett. (vol. 63, (1993) 3470) discloses a method for changing an energy level generated in a quantum well layer by using a superlattice structure in the case where a system having the same crystalline structure such as GaAs—AlAs and GaN—AlN is employed, thereby changing a wavelength of luminescence of the quantum well layer.

InN, having the same crystalline structure as GaN, is often used as a material to form a mixed crystal with GaN for obtaining a blue luminescence. Recently, a mixed crystal formed of GaN and a III-V group compound semiconductor other than nitride has been intensively studied. In such a study, attention has been focused on a mixed crystal of $GaP_{1-x}N_x$ or $GaAs_{1-x}N_x$ which is formed of GaN and GaP or GaAs (GaP and GaAs have a band gap of 2.78 eV and 1.42 eV (Γ point), respectively) because a blue luminescent material can be obtained by changing a molar fraction of the mixed crystal.

Figure 14:
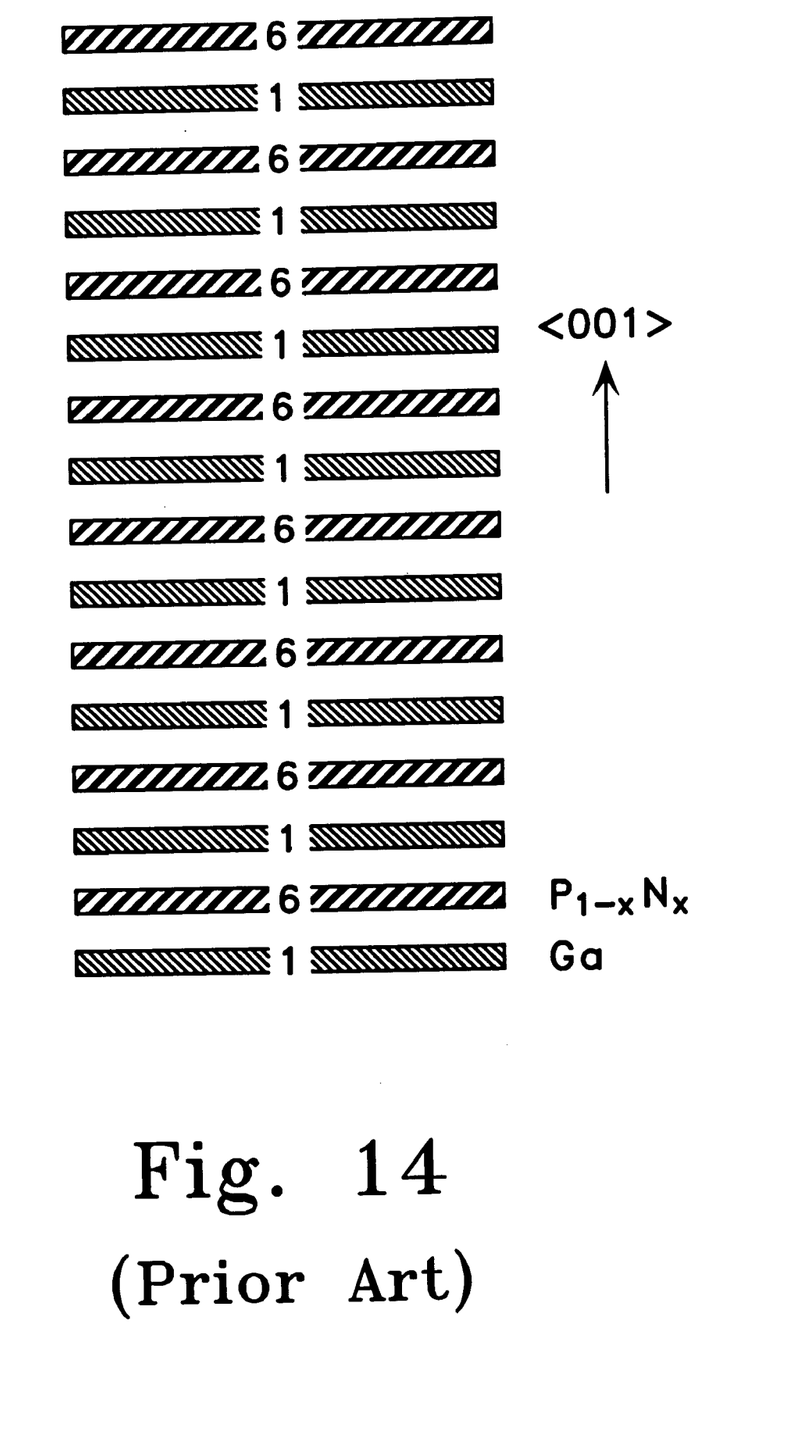
FIG. 14 is a schematic view showing a <001> orientation 8 atomic layers of $GaP_{1-x}As_x$ lattice.

For example, FIG. 14 shows a schematic view of $GaP_{1-x}N_x$ mixed crystal. As shown in the figure, $GaP_{1-x}N_x$ mixed crystal is formed by alternatively laminating a Ga surface 1 and a $P_{1-x}N_x$ surface 6.

Although $GaP_{1-x}N_x$ and $GaAs_{1-x}N_x$ have the above described characteristics, they have a great miscibility gap because a crystalline structure of GaN is different from GaP and GaAs (i.e., GaN has a wurtzite structure and GaP and GaAs have a zincblende structure) and the lattice mismatch is as great as 20%. Accordingly, in the case of $GaP_{1-x}N_x$, the obtained mixed crystal is limited to those having a molar fraction of $x \leq 0.076$ and $x \geq 0.91$ and in case of $GaAs_{1-x}N_x$, to those having a molar fraction of $x \leq 0.016$ (see Jpn. J. Appl. Phys. Vol. 31 (1992) 3791, Appl. Phys. Lett. Vol. 63 (1993) 3506, Appl. Phys. Lett. Vol. 62 (1993) 1396). As a result, a compound semiconductor and a luminescent device having a desired band gap has not been realized in the form of a mixed crystal.

SUMMARY OF THE INVENTION

The present invention provides a III-V compound semiconductor having a laminated super lattice structure in which a first monoatomic layer and a second monoatomic layer are regularly laminated, the first monoatomic layer formed by laminating 1 to 10 atomic layers of a group III atom selected from Al, Ga and In and 1 to 10 atomic layers of a group V atom selected from P, As and Sb, the second monoatomic layer formed by laminating 1 to 10 atomic layers of the group III atom and 1 to 10 atomic layers of a nitrogen atom.

The present invention also provides a semiconductor device comprising a substrate and a semiconductor layer with or without placing a buffer layer therebetween, the semiconductor layer comprising the III-V compound semiconductor and the buffer layer being formed of the same atomic layers as a monoatomic layer provided on the substrate side of the III-V compound semiconductor.

Further, the present invention provides a semiconductor device in which the semiconductor layer comprises a cladding layer, an active layer and a cladding layer, at least one of the cladding layer and the active layer being formed of the III-V compound semiconductor.

DETAILED DESCRIPTION OF THE INVENTION

A specific example of a combination used for a first monoatomic layer of the present invention includes AlP, GaP, InP, AlAs, GaAs, InAs, AlSb, GaSb and InSb.

A specific example of a combination used for a second monoatomic layer of the present invention includes AlN, GaN and InN.

The present invention may be a structure having only the first monoatomic layer or only the second monoatomic layer. However, the combination of the first and the second monoatomic layers are preferable.

A preferable combination of the first and second monoatomic layers are GaP and GaN, AlP and GaN, GaAs and GaN, GaSb and GaN, and AlAs and GaN.

The total number of lamination of the first and second monoatomic layers constituting a laminated superlattice structure comprising the III-V compound semiconductor is at least 2 depending on the type of atomic layer to be used, preferably 2 to 50,000, more preferably 2 to 1,000. The first and the second monoatomic layers are regularly laminated to constitute a lattice unit. Examples of cases where the lattice unit is not specified are the combinations of 2 second monoatomic layers, 1 first monoatomic layer and 5 second monoatomic layers; 6 second monoatomic layers and 2 first monoatomic layers; 1 second monoatomic layer, 1 first monoatomic layer, 5 second monoatomic layers and 1 first monoatomic layer; 7 second monoatomic layers and 1 first monoatomic layer; and 4 second monoatomic layers, 1 first monoatomic layer and 5 second monoatomic layers.

In the above described lattice unit, a preferred ratio of the second monoatomic layer to the whole monoatomic layers is 80 to 99.9%. Conventionally, a mixed crystal comprising the lattice unit having the ratio in the range above was not able to be grown.

The monoatomic layers may be prepared preferably by using the Molecular Organometallic Chemical Vapor Deposition (MOCVD) method, Atomic Layer Epitaxy (ALE) method or Molecular Beam Epitaxy (MBE) method. When the MOCVD is used, the following materials are used for forming the monoatomic layer: trimethylgallium (TMG), triethylgallium (TEG) etc. for Ga materials; phosphine ($PH_3$), tert-butyl phosphine etc. for P materials; arsine ($AsH_3$), tert-butyl arsine etc. for As materials; trimethylaluminum (TMA), triethylalminum etc. for Al materials; and ammonia ($NH_3$), dimethylhydrazine ($DMH_y$), azide compounds etc. for N materials. When the MBE method is used, N materials may be a nitrogen plasma source.

Generally, the semiconductor of the present invention may be formed on a substrate to provide a semiconductor device. The substrate used for the device of the present invention is not specifically limited. For example, a gallium substrate such as GaP, GaAs and GaSb, an indium substrate such as InP, InAs and InSb, a metal oxide substrate such as MgO and $NdGaO_3$, and a sapphire substrate and the like may be used. The substrate may have a conductivity of n type or p type. Examples of an impurity doped to the n type substrate are Si, Se, S and the like, and those doped to the p type substrate are Mg, Zn, Be and the like. Incidentally, the impurities described above may be doped to the first and/or the second monatomic layers.

A buffer layer may be laminated on the substrate for preventing a crystal structure of the first and the second monoatomic layers from being affected in the crystal structure of the substrate. The buffer layer is preferably the same type as the monoatomic layer on the substrate side of the III-V compound semiconductor. The thickness of the buffer layer is in the range from 0.005 μm to 0.1 μm. The MOCVD method or MBE method may be used for forming the buffer layer. Further, the buffer layer may have a conductivity of n type or p type. In the case of the MOCVD, when the buffer layer is formed of silicon, silane ($SiH_4$) is used as a dopant to give n type conductivity, and when it is formed of Se and S, $H_2Se$ and $H_2S$ are used to give n type conductivity. When the buffer layer is formed of magnesium, cyclopentadienyl magnesium ($Cp_2Mg$) is used as a dopant to give the p type conductivity, and when it is formed of Zn, DEZn is used. In the case of MBE, Si, S, Se, Zn and Be may be used as it is as a material.

The device of the present invention may be a luminescent device. Following is a detailed description for the luminescent device.

The luminescent device comprises a cladding layer (a first cladding layer), an active layer and a cladding layer (a second layer), in which at least one of the cladding layer and the active layer is formed of the III-V compound semiconductor.

When the III-V compound semiconductor is used as a lattice unit in the luminescent device, one or more lattice units are formed in at least one of the cladding layers and the active layer. In the following description, those in which a lattice unit is formed in the active layer refer to a superlattice active layer, and those in which a lattice unit is formed in the cladding layer refer to a superlattice cladding layer.

As the first cladding layer, a known cladding layer having a thickness of 100 nm to 10,000 nm may be used. Examples of the known cladding layers include $Al_xGa_{1-x}N$ layer (0 to $0.01 \leq x \leq 0.35$ to 0.4), GaN, $In_xGa_{1-x}N$ and the like. In addition, the first superlattice cladding layer formed of the III-V compound semiconductor described above may be used as the first cladding layer. The first superlattice cladding layer is formed by regularly laminating a plurality of the lattice units.

A preferable thickness of the first superlattice cladding layer is in the range from 100 to 10,000 nm. The band gap of the first cladding layer is preferably greater than that of the active layer because carriers are efficiently implanted to the active layer. A preferable band gap of the first cladding layer is greater 0.2 to 0.8 eV than that of the active layer. The first cladding layer may be formed by the known MOCVD or MBE method.

As the active layer, a known active layer or the superlattice active layer may be used. A preferable thickness of the active layer is in the range from 5 to 100 nm. A preferable band gap of the active layer is in the range from 2.2 to 3.2 eV. The known active layer may be formed, for example, by mixing crystals, while the superlattice active layer may be formed by the known MOCVD or MBE method.

The second cladding layer may be the same as the first cladding layer as described above. The second cladding layer may be formed by the known MOCVD or MBE method.

A semiconductor layer may be laminated on the second cladding layer for reducing an electric resistance. The semiconductor layer is preferably the same type as the atomic layer of the cladding layer which is in contact with the semiconductor layer, and the preferable thickness thereof is in the range from 0.05 µm to 0.5 µm. The semiconductor layer may have a conductivity of n type or p type, and it may be formed by the known MOCVD method or MBE method.

The luminescent device may be formed by providing the buffer layer and the semiconductor layer with an electrode. Examples of materials for the electrode include Au, In, Ni, Al and alloys thereof, but is not specifically limited thereto.

The electrode may be formed by the known vapor method, sputtering method and the like.

A laminated superlattice structure having the same band gap as that of a mixed crystal comprising the III-V compound semiconductor such as $GaP_{1-x}N_x$, $GaAs_{1-x}N_x$ and the like and the III-nitride compound semiconductor can be formed by using the monatomic laminated superlattice structure comprising the III-V compound semiconductor (the first monatomic layer) other than nitride and the III-nitride compound semiconductor (the second monatomic layer), whereby a crystal structure having the same band gap as that of the III-nitride compound semiconductor crystal having a high mixed crystal ratio can be provided.

The luminescent device comprising the monatomic layer laminated superlattice structure as the active layer and/or the cladding layer is capable of emitting a blue light similar to the light from which the III-nitride compound emits in the ultraviolet region.

Figure 1:
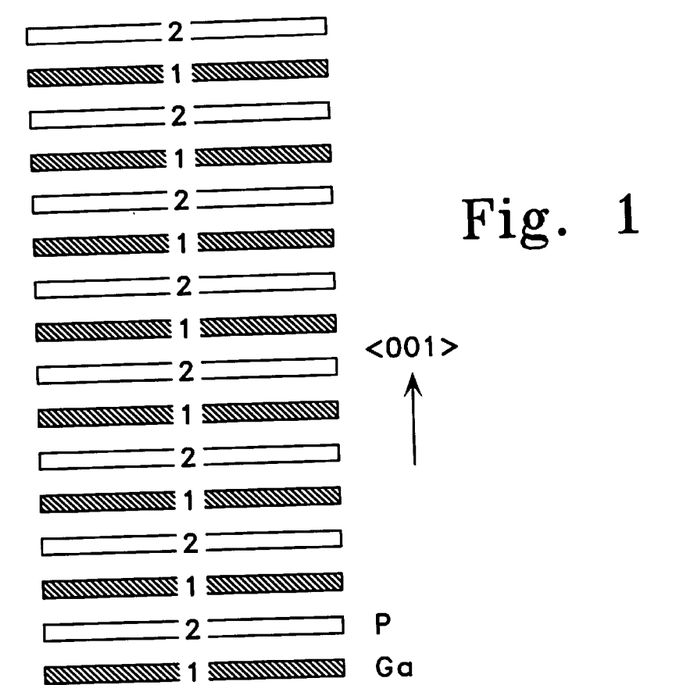
FIG. 1 is a schematic view showing a 8 atomic layers of <001> orientation of GaP lattice.
Figure 2:
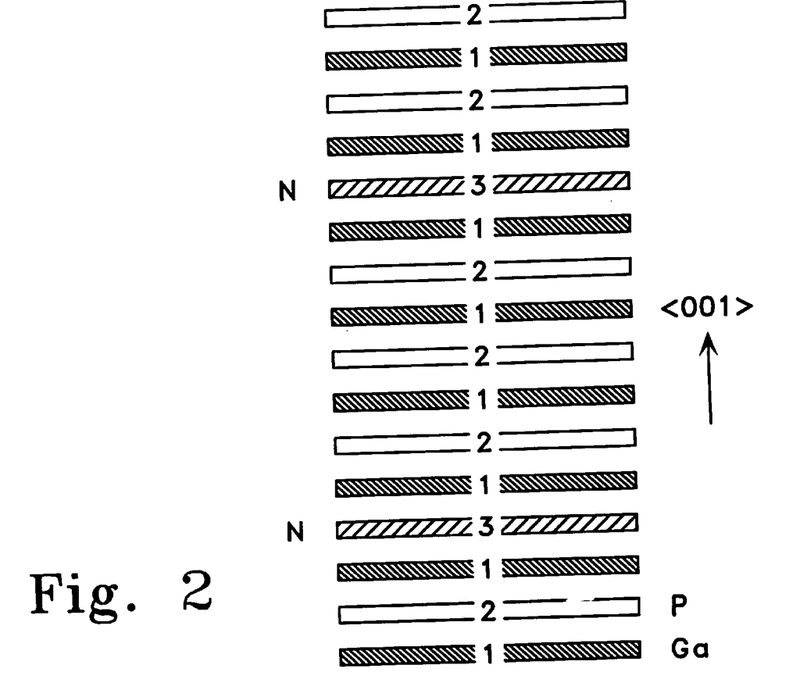
FIG. 2 is a schematic view showing a GaP—GaN monoatomic superlattice having a lattice unit of atomic layers of <001> orientation 8 in which two P surfaces of a GaP lattice are replaced with N surfaces.

FIGS. 1 and 2 show the monoatomic layer laminated superlattice structure by illustrating the GaP/GaN monoatomic layer superlattice in which 8 atomic layers are laminated in the <001> orientation. FIG. 1 is a schematic view showing GaP in which 8 layers are laminated in the <001> orientation. As the GaP has the zincblende type structure, Ga surface 1 and P surface 2 are alternatively present in <001> orientation. In FIG. 2, two P surfaces 2 in FIG. 1 are replaced with N surfaces 3, in which GaP is used for the first monoatomic layer and the zincblende GaN is used for the second monoatomic layer. The monoatomic superlattice structure shown in FIG. 2 comprises 6 first monoatomic layers, 2 second monatomic layers, 1 first monoatomic layer, 2 second monatomic layer, 3 first monoatomic layers, 1 second monoatomic layer, and 2 first monoatomic layers in this order. If 8 monatomic layers in FIG. 2 is considered to be a lattice unit, the ratio of P to N is 3:1, which is the same PN ratio as a $GaN_{0.25}PO_{0.75}$ mixed crystal. The PN ratio may be changed by varying the monoatomic superlattice structure by changing the number of the surfaces to be replaced to N surface 3 shown in FIG. 2.

Figure 3:
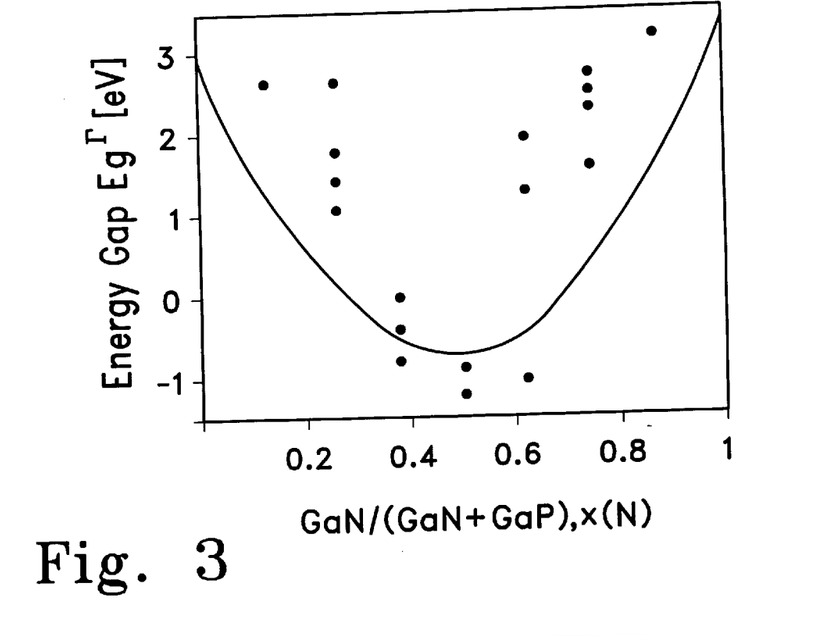
FIG. 3 is a view showing the results of a calculation of band gap of a GaP—GaN monatomic superlattice and a $GaN_xP_{1-x}$ mixed crystal when the number and lamination of GaP and GaN layers are changed in GaP—GaN monatomic superlattice comprising 8 atomic layers as a unit lattice.

The black dots in FIG. 3 refer to the results of a calculation of the orbit mutual interaction by a strong binding method using until the second approximation to show a band gap of the GaP/GaN pseudo monoatomic superlattice in which 8 atomic layers are laminated in the <001> orientation. The horizontal axis of FIG. 3 is the number of GaN monoatomic layers/the number of (GaN+GaP) monoatomic layers. The reason why the band gap has a plurality of values in the same composition is that there exists a plurality of combinations for the arrangement of GaP and GaN monoatomic layers. Alternatively, the solid line shown in FIG. 3 is the result of a calculation of band gap of the $GaP_{1-x}N_x$ mixed crystal. The horizontal axis for the solid line is the fraction ratio of N in $GaP_{1-x}N_x$. Although there exist a plurality of band gaps depending on the arrangement of GaP and GaN monoatomic layers, it is seen that the band gap of the GaP/GaN pseudo monoatomic superlattice is almost the same as that of the $GaP_{1-x}N_x$ mixed crystal. Alternatively, a GaP/GaN monoatomic layer superlattice having a band gap of $GaP_{1-x}N_x$, which conventionally has not been grown as a mixed crystal can be obtained by varying an arrangement by changing the number of lattice units of the GaP/GaN pseudo monoatomic superlattice. The technique of the present invention can be applied not only to the GaP/GaN and GaAs/GaN systems but also to any III-V compound semiconductor other than a nitride/III-nitride compound system.

In addition, if the superlattice active layer and/or the superlattice cladding layer in which a plurality of the lattice units described above are laminated regularly are formed in the luminescent device, a band gap suitable for emitting a blue light can be given to the active layer and the cladding layer.

EXAMPLES

Example 1

Figure 4:
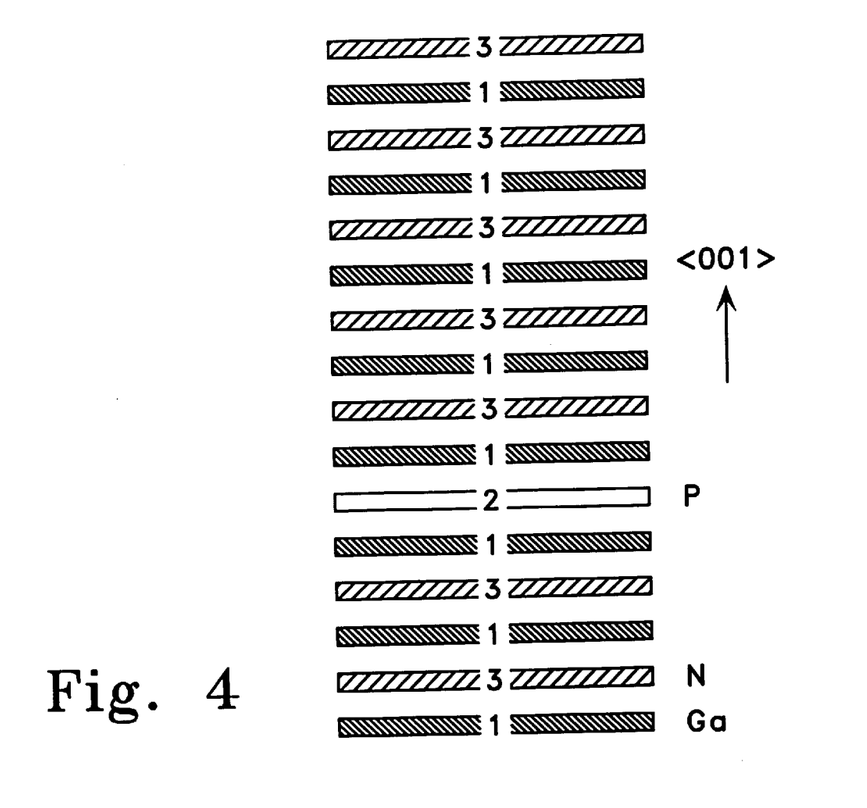
FIG. 4 is a schematic view showing a GaP—GaN monoatomic superlattice comprising 8 atomic layers of <001>orientation as a lattice unit in which seven P surfaces of GaP lattice are replaced with N surfaces.

A GaP buffer layer was grown on a GaP (001) substrate to a thickness of 0.3 µm at substrate temperature of 750° C. by using trimethylgallium (TMG) and phosphine ($PH_3$) by the MOCVD method. Subsequently, using TMG, $PH_3$ and ammonia ($NH_3$), a laminated superlattice structure comprising a GaP/GaN monoatomic layer was formed at a substrate temperature of 800° C., in which GaP was used as the first monoatomic layer and GaN was used as the second monoatomic layer, and 2 second monoatomic layers, 1 first monoatomic layer and 5 second monoatomic layers were laminated in this order as shown in FIG. 4.

The laminated superlattice structure was used as a lattice unit and 10 lattice units were laminated in series to form a sample, which was evaluated by X-ray diffraction and transmission electron microscope (TEM). It was found that GaN was grown on GaP in the form of a zincblende structure. When the photoluminescence of the sample was measured, a light having a peak at around 400 nm was emitted.

The ratio of the number of GaN monoatomic layers to the number of (GaN+GaP) monoatomic layers was 0.875. This was almost coincident with the results of the calculation shown in FIG. 3, by which a band gap shift due to the GaP/GaN monoatomic layer superlattice was confirmed.

Example 2

Figure 5:
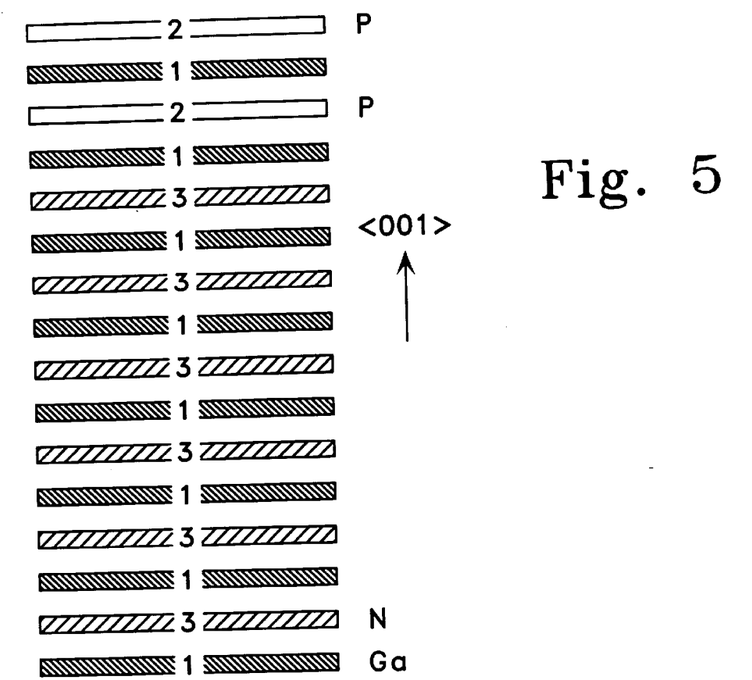
FIG. 5 is a schematic view showing a GaP—GaN monatomic superlattice comprising 8 atomic layers of <001> orientation as a lattice unit in which six P surfaces of GaP lattice are replaced with N surfaces.

A GaP buffer layer was grown on a GaP (001) substrate to a thickness of 0.3 µm at a substrate temperature of 750° C. by using TMG and $PH_3$ by the MOCVD method. Subsequently, using TMG, $PH_3$ and dimethylhydrazine ($DMH_y$), a laminated superlattice structure comprising a GaP/GaN monoatomic layer was formed at a substrate temperature of 700° C., in which GaP was used as the first monoatomic layer and GaN was used as the second monatomic layer, and 6 second monoatomic layers and 2 first monoatomic layers were laminated in this order as shown in FIG. 5.

The laminated superlattice structure was used as a lattice unit and 10 lattice units were laminated in series to form a sample, which was evaluated by X-ray diffraction and transmission electron microscope (TEM). It was found that GaN was grown on GaP in the form of a zincblende structure. When the photoluminescence of the sample was measured, a light having a peak at around 460 nm was emitted.

Figure 6:
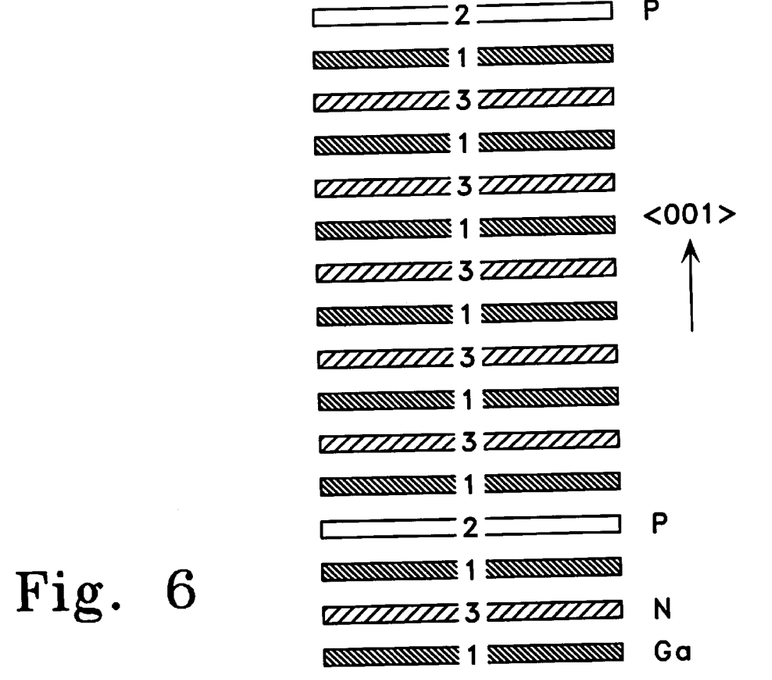
FIG. 6 is a schematic view seen from <001> orientation when a lamination structure of GaP and GaN is changed in the GaP—GaN monoatomic lattice shown in FIG. 5.
Figure 7:
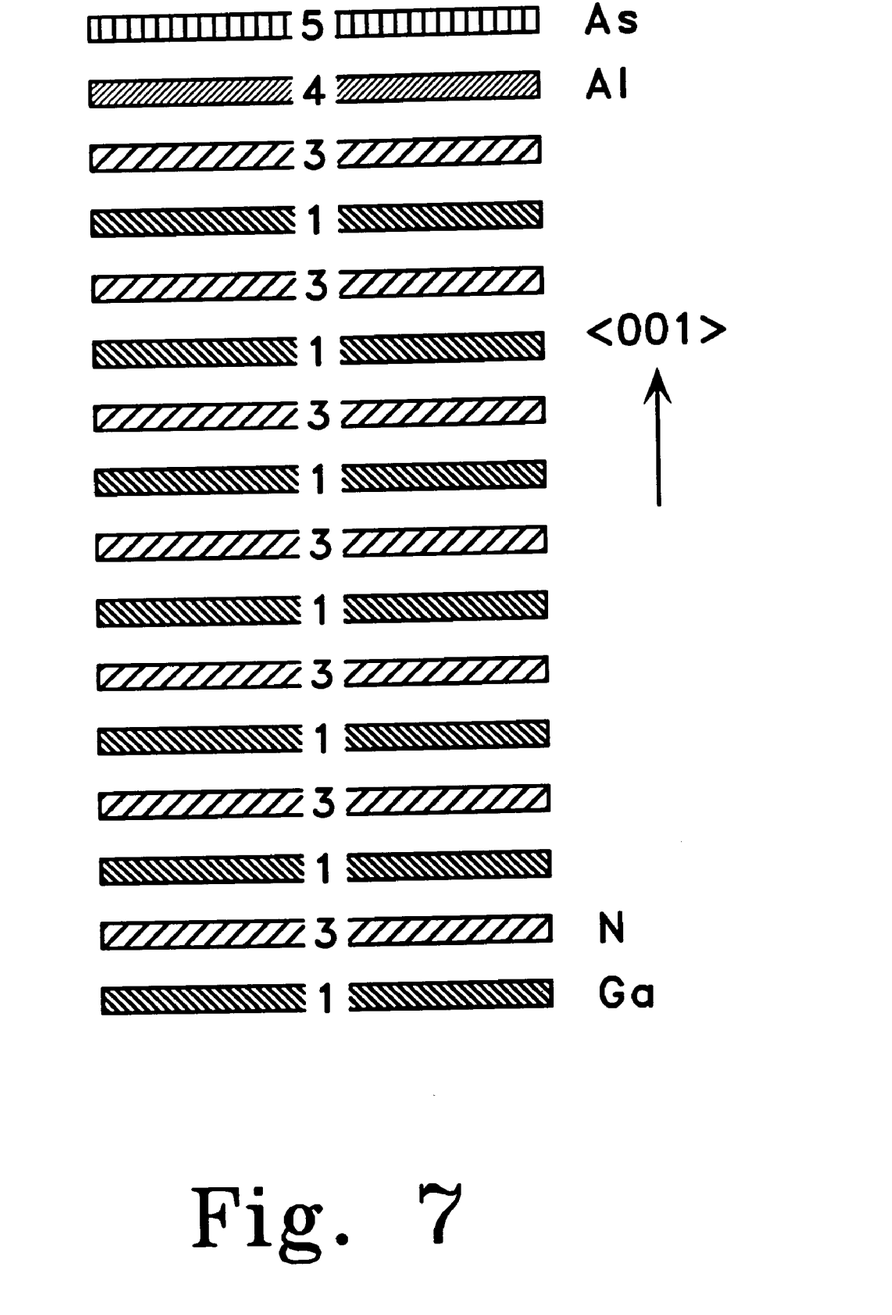
FIG. 7 is a schematic view of AlAs—GaN monoatomic superlattice comprising 8 atomic layers of <001> orientation as a lattice unit in which seven Al and As surfaces of AlAs lattice are replaced with Ga and N surfaces, respectively.
Figure 8:
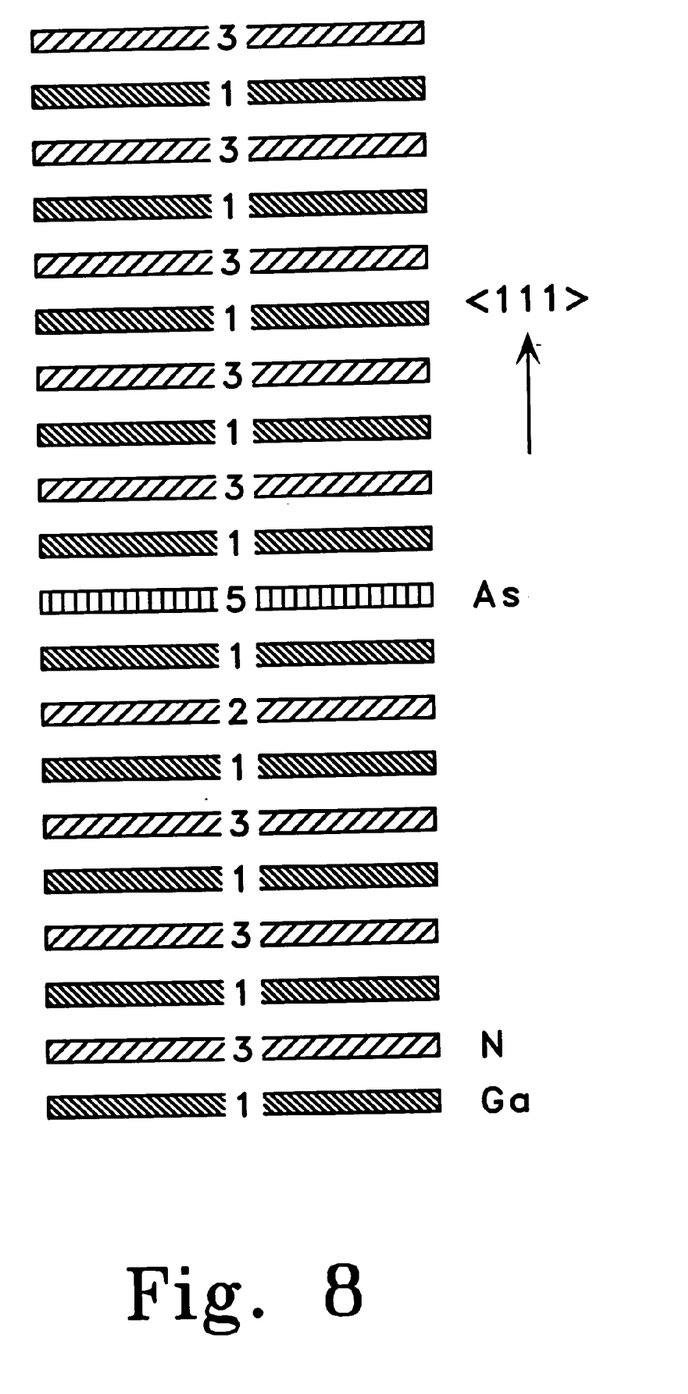
FIG. 8 is a schematic view showing GaP—GaN monoatomic superlattice comprising 10 atomic layers of <111> orientation as a lattice unit in which nine P surfaces of GaP lattice are replaced with N surfaces.

Under the same conditions of Example 2, a laminated superlattice structure comprising a GaP/GaN monoatomic layer was formed, in which 1 second monoatomic layer, 1 first monoatomic layer, 5 second monoatomic layers and 1 first monoatomic layer were laminated in this order as shown in FIG. 6.

The laminated superlattice structure was used as a lattice unit and 10 lattice units were laminated in series to form a sample. When the photoluminescence of the sample was measured, a light having a peak at around 775 nm was emitted.

The ratio of the number of GaN monoatomic layers to the number of (GaN+GaP monoatomic layers) was 0.75. This was almost coincident with the results of the calculation shown in FIG. 3, by which a band gap shift due to the GaP/GaN monoatomic layer superlattice and a band gap shift due to the change in the laminated layers of the GaP/GaN monoatomic superlattice was confirmed.

Example 3

A GaAs buffer layer was grown on a GaAs (001) substrate to a thickness of 0.3 μm at substrate temperature of 550° C. by using TMG and arsine ($AsH_3$) by the MOCVD method. Subsequently, using TMG, $AsH_3$ and $NH_3$, a laminated superlattice structure comprising a GaAs/GaN monoatomic layer was formed at a substrate temperature of 520° C., in which GaAs was used as the first monoatomic layer and GaN was used as the second monoatomic layer, and 2 second monatomic layers, 1 first monoatomic layer and 5 second monatomic layers were laminated in this order (similar to FIG. 4).

The laminated superlattice structure was used as a lattice unit and 10 lattice units were laminated in series to form a sample, which was evaluated by X-ray diffraction and transmission electron microscope (TEM). It was found that GaN was grown on GaAs in the form of a zincblende structure. When the photoluminescence of the sample was measured, a light having a peak at around 450 nm was emitted.

The ratio of the number of GaN monoatomic layers to the number of (GaN+GaAs monoatomic layers) was 0.875, by which a band gap shift due to the GaAs/GaN monoatomic layer superlattice was confirmed.

Example 4

A GaSb buffer layer was grown on a GaSb (100) substrate to a thickness of 0.3 μm at a substrate temperature of 500° C. by the MBE method. Subsequently, using a nitrogen plasma source, a laminated superlattice structure comprising a GaSb/GaN monoatomic superlattice layer was formed at a substrate temperature of 550° C., in which GaSb was used as the first monoatomic layer and GaN was used as the second monoatomic layer, and 2 second monatomic layers, 1 first monoatomic layer and 5 second monatomic layers were laminated in this order (similar to FIG. 4).

The laminated superlattice structure was used as a lattice unit and 10 lattice units were laminated in series to form a sample, which was evaluated by X-ray diffraction and transmission electron microscope (TEM). It was found that GaN was grown on GaSb in the form of a zincblende structure. When the photoluminescence of the sample was measured, a light having a peak at around 470 nm was emitted.

The ratio of the number of GaN monoatomic layers to the number of (GaN+GaSb monoatomic layers) was 0.875, by which a band gap shift due to the GaSb/GaN monoatomic layer superlattice was confirmed.

Example 5

A GaAs buffer layer was grown on a GaAs (001) substrate to a thickness of 0.3 μm at a substrate temperature of 550° C. by using TMG and $AsH_3$ by the MOCVD method. Subsequently, using trimethylaluminum (TMA) and $AsH_3$, AlAs was grown at a substrate temperature of 650° C. to a thickness of 0.05 μm. Then, using TMA, TMG, $AsH_3$ and $NH_3$, a laminated superlattice structure comprising AlAs/GaN was formed at a substrate temperature of 700° C., in which AlAs was used as the first monoatomic layer and GaN was used as the second monatomic layer, and 7 second monoatomic layers and 1 first monoatomic layer were laminated in this order.

The laminated superlattice structure was used as a lattice unit and 10 lattice units were laminated in series to form a sample, which was evaluated by X-ray diffraction and transmission electron microscope (TEM). It was found that GaN was grown on GaAs in the form of a zincblende structure. When the photoluminescence of the sample was measured, a light having a peak at around 390 nm was emitted.

The ratio of the number of GaN monoatomic layers to the number of (AlAs+GaN monoatomic layers) was 0.875. This was almost coincident with the results of the calculation shown in FIG. 3, by which a band gap shift due to the AlAs/GaN monoatomic layer superlattice was confirmed.

Example 6

A GaAs buffer layer was grown on a GaAs (111)B substrate to a thickness of 0.5 μm at a substrate temperature of 570° C. by the MBE method. Subsequently, using a nitrogen plasma source, a laminated superlattice structure comprising GaAs/GaN was formed at a substrate temperature of 550° C., in which GaAs was used as the first monoatomic layer and GaN was used as the second monoatomic layer, and 4 second monoatomic layers, 1 first monoatomic layer and 5 second monoatomic layers were laminated in this order.

The laminated superlattice structure was used as a lattice unit and 10 lattice units were laminated in series to form a sample, which was evaluated by X-ray diffraction and transmission electron microscope (TEM). It was found that GaN was grown on GaAs in the form of a zincblende structure. When the photoluminescence of the sample was measured, a light having a peak at around 430 nm was emitted.

The ratio of the number of GaN monoatomic layers to the number of (GaN+GaAs monoatomic layers) was 0.9, by which a band gap shift due to GaAs/GaN monoatomic layer superlattice was confirmed.

Example 7

A GaN buffer layer was grown on a MgO (001) substrate to a thickness of 1 μm at a substrate temperature of 650° C. by using TMG and $NH_3$ by the MOCVD method. Subsequently, using TMG, $AsH_3$ and $NH_3$, a laminated superlattice structure comprising a GaAs/GaN monoatomic layer was formed at a substrate temperature of 580° C., in which GaAs was used as the first monoatomic layer and GaN was used as the second monoatomic layer, and 2 second monoatomic layers, 1 first monoatomic layer and 5 second monoatomic layers were laminated in this order (similar to FIG. 4).

The laminated superlattice structure was used as a lattice unit and 10 lattice units were laminated in series to form a sample, which was evaluated by X-ray diffraction and transmission electron microscope (TEM). It was found that GaN was grown on MgO in the form of a zincblende structure. When the photoluminescence of the sample was measured, a light having a peak at around 400 nm was emitted.

The ratio of the number of GaN monoatomic layers to the number of (GaN+GaAs monoatomic layers) was 0.875, by which a band gap shift due to the GaAs/GaN monoatomic layer superlattice was confirmed.

Example 8

Figure 9:
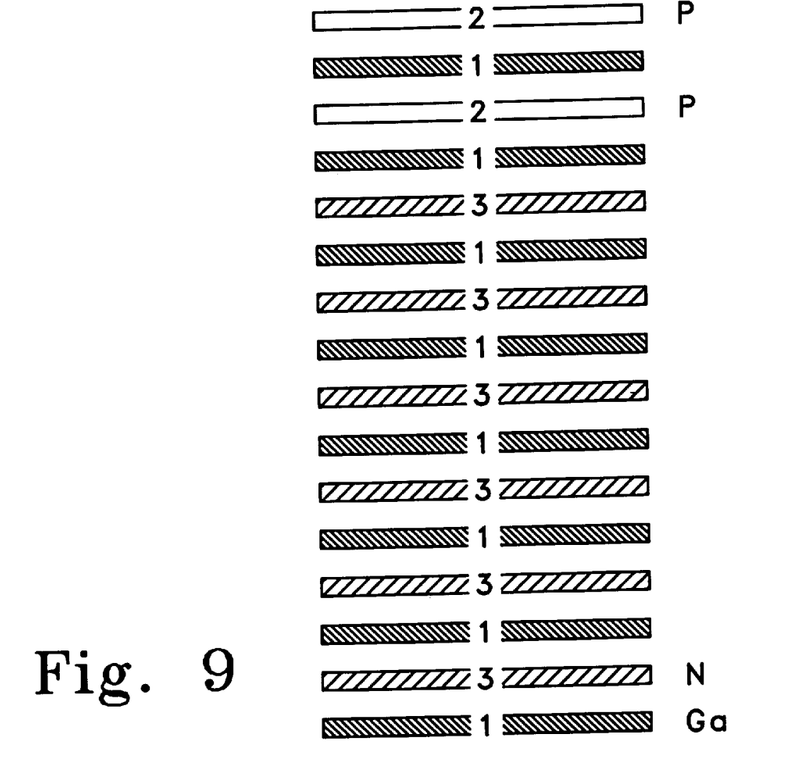
FIG. 9 is a schematic view showing GaP—GaN monoatomic superlattice in which two N surfaces of GaN lattice are replaced with P surfaces.

A GaN buffer layer was grown on a sapphire (0001) substrate to a thickness of 30 nm at a substrate temperature of 550° C. by using TMG and $NH_3$ by the MOCVD method. Subsequently, after growing GaN to a thickness of 4 μm by raising the substrate temperature to 1100° C., a laminated superlattice structure comprising a GaP/GaN monoatomic layer was formed at a substrate temperature of 700° C. by using TMG, $AsH_3$ and $NH_3$, in which GaP was used as the first monatomic layer and GaN was used as the second monoatomic layer, and 6 second monoatomic layers and 2 first monoatomic layers were laminated in this order as shown in FIG. 9.

The laminated superlattice structure was used as a lattice unit and 10 lattice units were laminated in series to form a sample, which was evaluated by X-ray diffraction and transmission electron microscope (TEM). It was found that GaN was grown on the sapphire in the form of a wurtzite structure and that a GaP (111) surface was grown on GaN in the form of a zincblende structure. When the photoluminescence of the sample was measured, a light having a peak at around 450 nm was emitted.

The ratio of the number of GaN monoatomic layers to the number of (GaN+GaAs monoatomic layers) was 0.75, by which a band gap shift due to the GaAs/GaN monoatomic layer superlattice was confirmed.

Example 9

Figure 10:
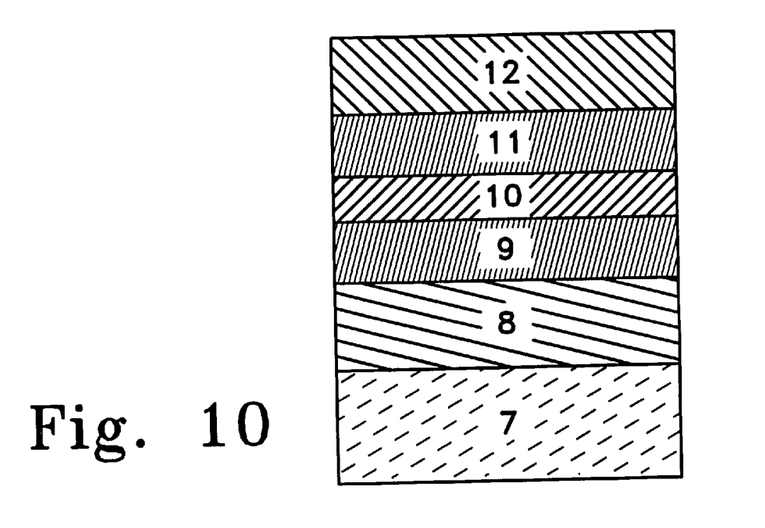
FIG. 10 is a structural view of an LED in which a GaAs—GaN monoatomic layer superlattice is used as an active layer.

An n-GaAs buffer layer 8 was grown to a thickness of 1 μm and an n-$Al_{0.1}G_{0.9}N$ cladding layer 9 was grown to a thickness of 100 nm, respectively by the MOCVD method on an n-GaAs (001) substrate 7 as shown in FIG. 10. Subsequently, a laminated superlattice structure comprising a GaAs/GaN monoatomic layer which was similar to the structure shown in FIG. 4 of Example 3 was formed on the n-$Al_{0.1}G_{0.9}N$ cladding layer 9. The laminated superlattice structure was used as a lattice unit and 10 lattice units were laminated in series as an active layer 10. A p-$Al_{0.1}G_{0.9}N$ cladding layer 11 and a p-GaN layer 12 were grown to a thickness of 100 nm and 300 nm, respectively on the active layer 10. In that process, TMG, TMA, $NH_3$ and $AsH_3$ were used as a material gas, and silane ($SiH_4$) and cyclopentadienyl magnesium ($Cp_2Mg$) were used as an n-type dopant and p-type dopant, respectively. Then, an electrode (not shown) was formed by using AuNi for the p-GaN layer 12 and AuGeNi for the n-GaAs substrate 7, thereby obtaining a luminescent device (hereinafter referred to LED).

When an operating voltage of about 4.0 V was applied to the LED, the electric current was 20 mA and a blue light having a peak wavelength of 450 nm was emitted.

Example 10

Figure 11:
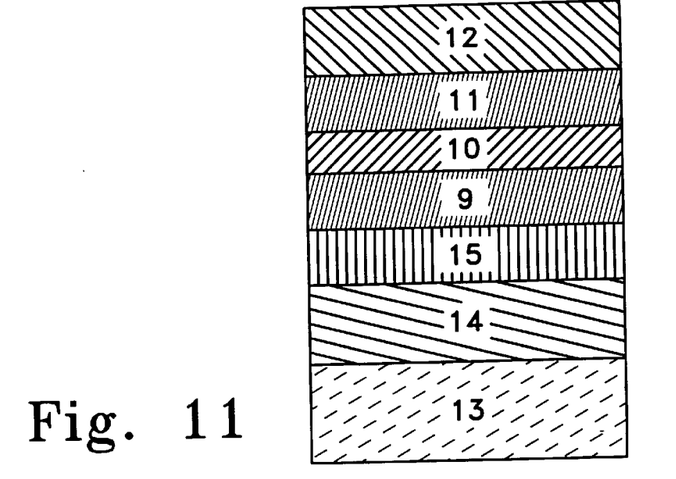
FIG. 11 is a structural view of an LED in which a GaP—GaN monoatomic layer superlattice is used as an active layer.

A GaN buffer layer 14, an n-GaN layer 15 and an n-$Al_{0.1}G_{0.9}N$ cladding layer 9 were grown on a sapphire (0001) substrate 13 to a thickness of 30 nm, 4 μm and 100 nm, respectively by the MOCVD method as shown in FIG. 11. Subsequently, a laminated superlattice structure comprising a GaP/GaN monoatomic layer shown in FIG. 9 of Example 8 was used as a lattice unit, and 10 lattice units were laminated in series to form an active layer 10. Then, a p-$Al_{0.1}G_{0.9}N$ cladding layer 11 and a p-GaN layer 12 were grown thereon to a thickness of 100 nm and 300 nm, respectively. In that process, TMG, TMA, $NH_3$ and $AsH_3$ were used as a material gas, and silane ($SiH_4$) and cyclopentadienyl magnesium ($Cp_2Mg$) were used as an n-type dopant and p-type dopant, respectively. Then, an electrode (not shown) was formed by using AuNi for the p-GaN layer 12 and Au for the n-GaN layer 15, thereby obtaining an LED.

When an operating voltage of about 3.8 V was applied to the LED, the electric current was 20 mA and a blue light having a peak wavelength of 450 nm was obtained.

Example 11

Figure 12:
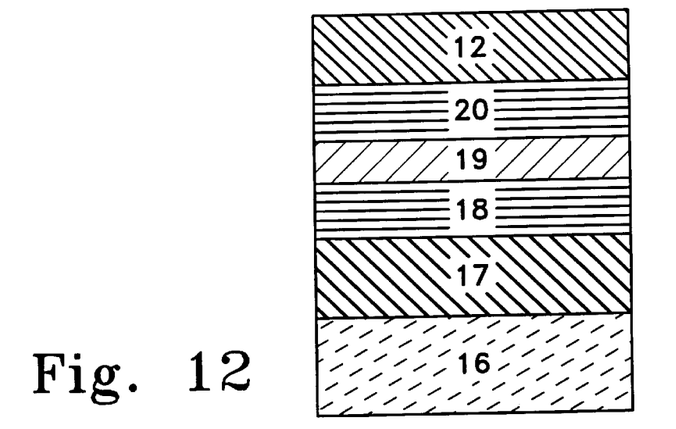
FIG. 12 is a structural view of an LED in which a GaP—GaN monoatomic layer superlattice is used as a cladding layer and an active layer.

An n-GaP buffer layer 17 was grown to a thickness of 1 μm on an n-GaP (001) substrate 16 by the MOCVD method as shown in FIG. 12. Subsequently, a laminated superlattice structure comprising a GaP/GaN monoatomic layer as a cladding layer 18 which has the structure shown in FIG. 4 of Example 1 was formed. The laminated superlattice structure was used as a lattice unit and the lattice unit was grown to a thickness of 100 nm.

After that, a laminated superlattice structure comprising a GaP/GaN monoatomic layer which has the structure of FIG. 5 of Example 2 was formed. The laminated superlattice structure was used as a superlattice unit, and 10 lattice units were laminated in series to form an active layer 19.

Next, a laminated superlattice structure comprising a GaP/GaN monoatomic layer which has the structure of FIG. 4 was used as a lattice unit. The lattice unit was grown to a thickness of 100 nm as a p-cladding layer 20 on the active layer 19, and a p-GaN layer 12 was grown thereon to have a thickness of 300 nm. In that process, TMG, $NH_3$ and $PH_3$ were used as a material gas, and silane ($SiH_4$) and cyclopentadienyl magnesium ($Cp_2Mg$) were used as an n-type dopant and p-type dopant, respectively. Then, an electrode (not shown) was formed by using AuNi and AuGeNi for the p-GaN layer 12 and the n-GaP substrate 16, thereby obtaining an LED.

When an operating voltage of about 4.0 V was applied to the LED, the electric current was 20 mA and a blue light having a peak wavelength of 460 nm was obtained.

Example 12

Figure 13:
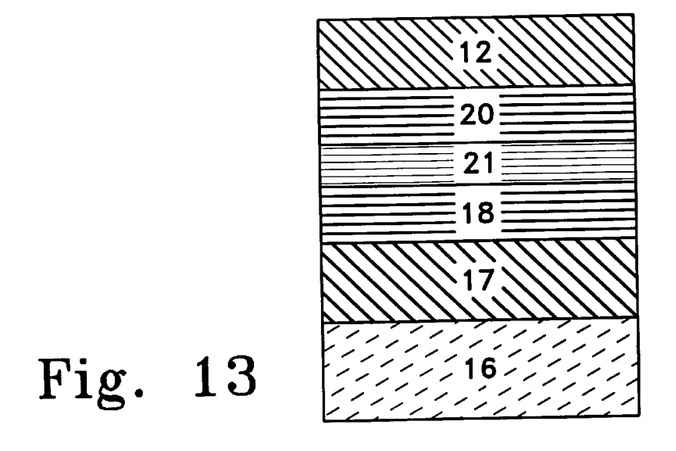
FIG. 13 is a structural view of an LED in which $In_{0.1}Ga_{0.9}N$ is used as an active layer and GaP—GaN monoatomic layer superlattice is used as a cladding layer.

An n-GaP buffer layer 17 was grown to a thickness of 1 μm on an n-GaP (001) substrate 16 by the MOCVD method as shown in FIG. 13. Subsequently, a laminated superlattice structure comprising a GaP/GaN monatomic layer as an n-cladding layer 18 which has the structure shown in FIG. 4 of Example 1 was formed. The laminated superlattice structure was used as a lattice unit and the lattice unit was grown to a thickness of 100 nm.

After that, $In_{0.1}Ga_{0.9}N$ was grown to a thickness of 30 nm to form an active layer 21.

Next, a laminated superlattice structure comprising a GaP/GaN monoatomic layer which has the structure of FIG. 4 was used as a lattice unit. The lattice unit was grown to a thickness of 100 nm as a p-cladding layer 20 on the active layer 19, and a p-GaN layer 12 was grown thereon to have a thickness of 300 nm. In that process, TMG, TMIn, $NH_3$ and $PH_3$ were used as a material gas, and silane ($SiH_4$) and cyclopentadienyl magnesium ($Cp_2Mg$) were used as an n-type dopant and p-type dopant, respectively. Then, an electrode (not shown) was formed by using AuNi and AuGeNi for the p-GaN layer 12 and the n-GaP substrate 16, thereby obtaining an LED.

When an operating voltage of about 3.8 V was applied to the LED, the electric current was 20 mA and a blue light having a peak wavelength of 405 nm was obtained.

Although ten lattice units were laminated in Examples 9 to 12 to form the active layer and/or cladding layer in the LED, the present invention is not limited thereto. For example, the same effect can be obtained by laminating less than 10 lattice units to form a thin LED, or by laminating more than 10 units, such as 20 and 30 units to form a thick LED. The number of units to be laminated (the thickness of the device) may be defined in view of the combination with other layers.

According to the present invention, it is possible to provide the III-V compound semiconductor having a laminated superlattice structure with a band gap similar to the mixed crystal comprising the III-V compound semiconductor other than nitride and the III-nitride compound semiconductor, which had not been realized as a mixed crystal of the III-nitrogen compound semiconductor having a high mixed crystal ratio. Moreover, the luminescent device comprising the III-V compound semiconductor having the laminated superlattice structure as the active layer and/or cladding layer readily emits a blue light which was conventionally difficult to obtain.

What we claim is:

1. A nitride type III-V compound semiconductor comprising a laminated super lattice structure of one of a group comprising wurtzite structure or zincblende structure, the laminated super lattice structure being formed by alternately laminating an atomic of a group III atom selected from Al, Ga and In and an atomic layer of nitrogen the atomic layers not being in one plane, and the atomic layer of nitrogen being periodically replaced with an atomic layer of a group V atom selected from As, P and Sb in the laminating direction.

2. A semiconductor according to claim 1, in which the laminated super lattice structure comprises wurtzite structure and the atomic layer of nitrogen is periodically replaced with the atomic layer of the group V atom in a c-axis direction.

3. A semiconductor according to claim 1, in which the laminated super lattice structure comprises zincblende structure and the atomic layer of nitrogen is periodically replaced with the atomic layer of the group V atom in a <100> or <111> direction.

4. A semiconductor according to claim 1, in which the atomic layer of the group V atom except nitrogen occupies approximately 5 to 95% of the total amount of the atomic layer of the group V atom except nitrogen and the atomic layer of nitrogen.

5. A semiconductor according to claim 1, in which the laminated super lattice structure comprises a nitrogen compound semiconductor formed of one of a group of GaN, AlN, InN or a mixed crystal thereof and a semiconductor formed of one of a group of GaAs, AlAs, InAs, GaP, AlP, InP, GaSb, AlSb, InSb or a mixed crystal thereof.

6. A semiconductor device comprising a substrate and a semiconductor layer with or without intervening a buffer layer therebetween, the semiconductor layer comprising the III-V compound semiconductor of claim 1 and the buffer layer being formed of the same atomic layer as the atomic layer provided on the substrate side of the Ill-V compound semiconductor.

7. A semiconductor device according to claim, in which the semiconductor layer comprises a cladding layer, an active layer and a cladding layer, at least one of the cladding layer and the active layer being formed of the III-V compound semiconductor.

8. A semiconductor device according to claim 7, in which the cladding layer has a thickness of approximately 0.1 µm to 10 µm.

9. A semiconductor device according to claim 7, in which the cladding layer has a band gap greater than that of the active layer.

* * * * *